United States Patent
Nishihara et al.

[11] Patent Number: 5,909,156
[45] Date of Patent: Jun. 1, 1999

[54] SURFACE ACOUSTIC WAVE DEVICE WITH MULTILAYER ELECTRODES AND METHOD FOR MANUFACTURING THE SAME

[75] Inventors: Tokihiro Nishihara; Hidema Uchishiba; Osamu Ikata; Yoshio Satoh, all of Kanagawa, Japan

[73] Assignee: Fujitsu Limited, Kanagawa, Japan

[21] Appl. No.: 08/762,031

[22] Filed: Dec. 11, 1996

[30] Foreign Application Priority Data

Dec. 13, 1995 [JP] Japan .................................. 7-324743
Nov. 15, 1996 [JP] Japan .................................. 8-305205

[51] Int. Cl.$^6$ .......................... H03H 9/145; H03H 9/25; H03H 9/64
[52] U.S. Cl. .................. 333/193; 310/313 R; 310/364; 29/25.35
[58] Field of Search ................... 333/193–196; 310/313 R, 313 B, 313 C, 313 D, 363, 364; 29/25.35

[56] References Cited

U.S. PATENT DOCUMENTS 4,775,814  10/1988  Yuhara et al. .................. 310/364 X
4,942,327   7/1990  Watanabe et al. ............... 310/364 X

FOREIGN PATENT DOCUMENTS

2711863A1   5/1995  France .................................. 310/364
62-168410   7/1987  Japan .................................. 333/195
4-288718   10/1992  Japan .................................. 310/313 B
6-350377   12/1994  Japan .
8-330892   12/1996  Japan .

*Primary Examiner*—Robert Pascal
*Assistant Examiner*—Barbara Summons
*Attorney, Agent, or Firm*—Armstrong, Westerman, Hattori, McLeland, & Naughton

[57] ABSTRACT

A surface acoustic wave device includes an electrode formed by a first film and a second film on a substrate, the first film including an Al film or a film formed by adding at least one other element to Al, and the second film including a metal whose coefficient of diffusion into Al is greater than a self diffusion coefficient of Al. The present invention contributes to improvement of the high-power durability of the electrodes.

13 Claims, 6 Drawing Sheets

INPUT SIDE         OUTPUT SIDE

1 : 45.549dB
   849MHz
3 : 3.4952dB
   869MHz
4 : 3.4894dB
   894MHz

SURFACE ACOUSTIC WAVE DEVICE WITH MULTILAYER ELECTRODES AND METHOD FOR MANUFACTURING THE SAME

BACKGROUND OF THE INVENTION

1. Field of the Invention

The present invention relates to a surface acoustic wave device and a method for manufacturing the same. More particularly, the present invention relates to a surface acoustic wave device having an improved high-power durability. The surface acoustic wave device of the present invention can be used as a surface acoustic wave device (a resonator, an interstage filter, a duplexer, or the like) in mobile communication terminals such as automobile phones and portable phones.

2. Description of the Related Art

Recently, development of smaller and less heavy mobile communication terminals such as automobile phones and portable phones has been rapidly taking place. In accordance with this development, there is an increasing need for smaller and more efficient parts for the mobile communication terminals, giving rise to the need also for surface acoustic wave (SAW) devices (resonators, interstage filters, duplexers, and the like) that contribute to miniaturization of high frequency (RF) sections.

Among the above duplexers, the antenna duplexer is typically located at the front end section of the RF section and requires large high-power durability. Here, since conventional SAW devices do not have sufficient high-power durability, dielectric filters have been used. Having a large size, however, the dielectric filters have been an obstacle to miniaturization.

On the other hand, in accordance with the development of SAW devices for higher frequency, the electrodes constituting the SAW devices have been miniaturized, and their high-power durability has been a point of issue in applying the devices to, for example, semi-microwave band filters.

In order to improve the high-power durability of the SAW devices, the following techniques have been reported.

1. Japanese Laid-open Patent Application (Kokai) No. SHO 63(1988)-278343 discloses a technique for improving high-power durability of the SAW device by utilizing an Al alloy having Ge added thereto at 0.1 to 5 wt % as a material for a comb-like electrode formed on a piezoelectric wafer of the SAW device so as to suppress the electromigration due to the movement of Al atoms caused by high density currents, thereby reducing the generation of defects (voids) or projections (hillocks).

2. Japanese Laid-open Patent Application (Kokai) No. HEI 2(1990)-274008 discloses a technique for improving high-power durability of the SAW device by utilizing an Al alloy having Pd added thereto at 0.1 to 0.3 wt % or an Al alloy having Pd with the crystal diameter of less than 0.05 $\mu$m added thereto at 0.1 to 0.3 wt % as a material for a comb-like electrode formed on a piezoelectric wafer of the SAW device so as to suppress stress migration due to the movement of Al atoms caused by high density currents, thereby reducing the generation of voids or hillocks.

3. Japanese Laid-open Patent Application (Kokai) No. HEI 7(1995)-221578 discloses a technique for improving high-power durability by forming a film having a tensile stress on the back side of the piezoelectric wafer and by forming a film having a compressive stress on the comb-like electrode to utilize these stresses.

4. Japanese Laid-open Patent Application (Kokai) No. HEI 5(1993)-14118 and Japanese Laid-open Patent Application (Kokai) No. HEI 5(1993)-3417 disclose a technique for improving high-power durability by dividing a SAW device into a plurality of unit filters formed on a common piezoelectric wafer or on separate piezoelectric wafers so as to constitute a system of filters disposed in series by connecting the input and output terminals of these unit filters in series, or a system of filters disposed in parallel by connecting the input and output terminals of these unit filters in parallel, thereby equally dividing a high power input by the number of unit filters.

5. Japanese Laid-open Patent Application (Kokai) No. HEI 6(1994)-29779 discloses a technique for improving high-power durability in a ladder-like SAW device in which the comb-like electrodes are interdigitally aligned and in which the first resonators having a predetermined resonance frequency are arranged in a parallel arm and the second resonators having a resonance frequency at least approximately equal to the antiresonance frequency of the first resonators are arranged in a series arm in a plurality of stages. Here, high-power durability is improved by setting the number of electrode finger pairs of the series resonator at the first stage to be greater than the number of electrode finger pairs of the series resonators at the other stages so as to reduce the electric currents flowing through each of the electrodes in the second resonator at the first stage, thereby suppressing the temperature increase.

However, even the above techniques do not provide sufficient high-power durability. Accordingly, the following techniques have been reported considering the material to be used for the electrodes constituting the SAW devices.

(1) Article "Thin Film Alloyed Aluminum and its Deposition for High Power Durable SAW Devices" on pages 7–12 of the Preliminary Drafts for 17th EM Symposium (Yuhara et al.) describes use of Ti as a metal to be added into Al alloy. By changing the electrode material to be Al—Ti alloy, the lifetime of the SAW device was increased to 10 times that of the Al—Cu alloy film. However, with such an increase, the high-power durability is still insufficient.

(2) Journal of Electronic Information Communication Society, Vol. J76-A, No. 2, pp. 145–152 (1993) (Ieki et al.) describes use of epitaxially grown Al single crystal film. This article utilizes a property that the use of a single crystal film can suppress intergranular diffusion in stress migration.

The increase of the lifetime by this method is reported to be 2000 times that of the Al—Cu alloy film formed by vapor deposition. Since the Al—Cu alloy film formed by vapor deposition naturally has a lifetime shorter by one to two orders of magnitude than the film formed by the sputtering method (See the article in the above (1)), it is understood that the lifetime is shorter substantially by 20 to 200 times. However, this method is disadvantageous in that the applicable underlying substrate or its cut surface is limited and, moreover, has poor mass-productivity.

(3) The stress migration in the SAW device is, on some points, similar to the electromigration or stress migration in the wiring technique of semiconductor devices. Accordingly, this wiring technique can be a reference for the anti-stress-migration technique in the SAW devices. An example thereof is a technique disclosed in U.S. Pat. No. 4,017,890 (April 1977, J. K. Howard in IBM) and reported, in association therewith, in J. K. Howard: J. Appl. Phys., Vol. 49, P. 4083 (1978).

This technique involves forming a layered intermetallic compound of Al and a transition metal in the middle of the Al film so as to block the electromigration of Al atoms by the intermetallic compound. This article discloses that, if Cr is used as the transition metal, the maximum lifetime attained is 10 times that of the Al—Cu alloy film. However, when the inventors of the present invention applied this technique to the electrodes of a SAW device, it was not possible to obtain a sufficient effect.

On the other hand, the inventors of the present invention have filed an application, Japanese Laid-open Patent Application (Kokai) No. HEI 7(1995)-122961, disclosing a technique for improving the high-power durability of the SAW device by laminating a plurality of Al—Cu alloy films and Cu films to form an electrode and utilizing the fine crystal grains constituting these films and the blocking effect of the alloy film.

Here, the weight of the electrode constituting the SAW device greatly affects a property such as the frequency. Therefore, the weight of the electrode is limited to a certain value in accordance with the use of the SAW device. When the technique disclosed in Japanese Laid-open Patent Application No. HEI 7(1995)-122961 is studied from this view point, it is to be understood that, since the specific weight of Cu is 3.3 times larger than the specific weight of Al, Cu will shift the property 3.3 times more than Al even if the change in the film thickness is the same.

Alternatively, a method of reactive ion etching (RIE) for forming a fine pattern of electrodes is known. However, it is known that it is difficult to apply this method to Cu.

SUMMARY OF THE INVENTION

In view of solving the aforementioned problem, the inventors have conducted thorough research for improving the high-power durability and made the present invention so as (1) to reduce the size of the crystal grains in the electrode material and (2) to form a blocking layer for preventing the growth of the voids or the movement of Al atoms.

Accordingly, the present invention provides a surface acoustic wave device comprising an electrode formed by a first film and a second film on a substrate, the first film comprising an Al film or a film formed by adding at least one other element to Al, and the second film comprising a metal whose coefficient of diffusion into Al is greater than a self diffusion coefficient of Al.

Also, the present invention provides a method of manufacturing a surface acoustic wave device, comprising an electrode formation step and subsequent necessary steps for completing the device, wherein the electrode formation steps includes laminating a first film and a second film on a substrate and patterning the laminated films into a desired shape, the first film comprising an Al film or a film formed by adding at least one other element to Al, the second film comprising a metal whose coefficient of diffusion into Al is greater than a self diffusion coefficient of Al, and all the steps being performed at temperatures below 200° C.

DETAILED DESCRIPTION OF THE PREFERRED EMBODIMENTS

Figure 1:
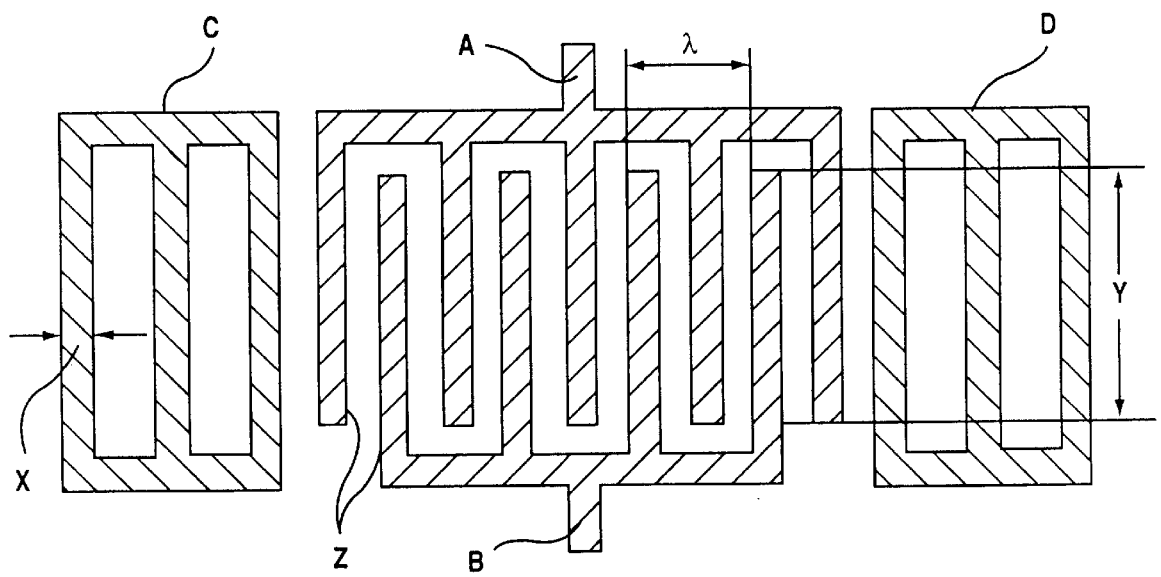
FIG. 1 is a schematic plan view showing an electrode of a SAW device according to the present invention.

The surface acoustic wave (SAW) device of the present invention will now be described based on the manufacturing method of the device.

First, the substrate to be used for the present invention is not specifically limited as long as it can be used for a surface acoustic wave (SAW) device. The substrate may be, for example, $LiTaO_3$, $LiNbO_3$, or quartz.

Next, an electrode is formed on the substrate. The electrode is formed by laminating and patterning a first film and a second film on the substrate, the first film comprising an Al film or a film formed by adding at least one other element to Al, and the second film comprising a metal whose coefficient of diffusion into Al is greater than a self diffusion coefficient of Al.

Here, in the method of manufacturing the SAW device according to the present invention, the electrode formation step and the subsequent step for completing the SAW device are preferably performed at a temperature below 200° C. in view of reducing the size of the crystal grains in the electrode material. Therefore, the step of laminating the electrodes formed by the first film and the second film must also be performed below this temperature. One example of a lamination method satisfying the above requirement is a sputtering method (specifically, a DC magnetron sputtering method).

Further, the substrate temperature at the time of forming the electrode (the first film and the second film) is preferably below 200° C. This is because a substrate temperature below 200° C. reduces the size of the grains constituting the electrode and improves the anti-migration property and the high-power durability of the SAW device.

The other element to be added into the first film is preferably an element which shows excellent anti-migration property when it is added to Al at the ratio of several percent. Examples of such elements include Mg, Cu, Ti, Pd, Ge and Si. These other elements may be added singly or in combination. The ratio of addition of the other element may vary in accordance with the kind of the element, but the ratio is typically below 10% by weight. If the ratio is above 10% by weight, it is not preferable because the resistance of the electrode will rise, causing large loss in SAW device property. The ratio of addition is more preferably within the range from 1 to 3 % by weight. This is because the above range maintains good balance between the high-power durability and the loss in device property.

Here, an especially preferable example of the above first film is an alloy or solid solution film such as Al—Mg, Al—Cu or Al—Ti.

Generally, the Al metal in pure form shows a poor anti-migration property and may be inferior to the Al—(several percent)Cu single layer film conventionally used for the electrode in SAW devices. Accordingly, the Al metal may be subjected to heat treatment at a high temperature for forming an alloy or solid solution with another metal. However, such a high-temperature heat treatment increases the particle diameter of the crystals and/or generate hillocks, thereby deteriorating the high-power durability. Therefore, if a metal capable of forming an alloy with Al at a temperature of 200° C. or less is used, it is possible to form, with ease, an alloy layer or solid solution layer which can prevent growth of voids and/or diffusion of Al atoms without causing the above-mentioned problem.

On the other hand, the second film comprises a metal whose coefficient of diffusion into Al is greater than a self diffusion coefficient of Al. Preferred examples of the metal for the second film include Mg, Si, In, Ge, Li, Na, Mn, Ag, Au, Ga and Co.

Among these metals, a metal different from Ag and Au and lighter than Cu is preferably used for the second film for reducing the frequency shift in device property. For example, the specific weight of Mg is 20% of the specific weight of Cu and is less heavy than Al.

The electrode formed according to the present invention may comprise an alloy layer or solid solution layer formed by interdiffusion of the first and second films, or comprise the first film, the second film and an alloy layer or solid solution layer formed at the interface between the first film and the second film.

The total thickness of the first and second films can be determined based on weight in accordance with the filter design, and the film thickness ratio is suitably selected by taking the electrode resistance and the anti-migration property into account. Particularly, if the second film is formed of Mg, the thickness of the second film is preferably from 5 to 20% of the total thickness of the electrode. The above range further increases the high-power durability of the surface acoustic wave device.

The number of each of the first film and the second film to be laminated is not specifically limited as long as it is at least one. Therefore, a laminate including one layer of one kind of film and two layers of the other kind of film or a laminate including two or more layers of one kind of film and two or more layers of the other kind of film are also contemplated to be comprised within the scope of the present invention. Here, the uppermost layer is preferably made of the first film in view of the affinity with the bonding wire metal or the stability. The laminating order of the first film and the second film may be such that the first film forms a lower layer and the second film forms an upper layer, or vice versa. Further, a three-layer structure formed of first film/second film/first film is especially preferable in view of improving the yield and the high-power durability because the film thickness can be comparatively easily controlled.

The electrode laminated on the substrate may be patterned into a desired shape by a known etching method. A preferable etching method may be, for example, a dry etching method such as Reactive Ion Etching (RIE) method or an Ion Milling method. Among these, the RIE method is preferable because the damage to the substrate will be small and a finer pattern can be formed.

Next, an example of the construction of the SAW device (resonator) according to the present invention will now be described in conjunction with FIG. 1 (a schematic plan view). Referring to FIG. 1, the SAW resonator of the present invention is typically formed of two reflectors (C, D) and a pair of comb-like electrodes (A, B).

The SAW resonator of FIG. 1 is typically connected to an adjacent SAW resonator in parallel and/or in series. Here, the width X of the electrode of the comb-like electrode of the SAW resonators connected in parallel (hereafter referred to as parallel SAW resonators) is preferably different from the width X of the electrode of the electrode of the comb-like electrode of the SAW resonators connected in series (hereafter referred to as series SAW resonators) so as to give different resonance frequencies. More specifically, when a 36° Y cut-X propagation LiTaO$_3$ substrate is used in a 800 MHz band filter, the width X of the parallel SAW resonators is preferably 1.17 to 1.23 $\mu$m and the width X of the series SAW resonators is preferably 1.12 to 1.18 $\mu$m if the filter is to be used as a transmitting filter for AMPS (Advanced Mobile Phone System). On the other hand, if the filter is to be used as a receiving filter for AMPS, the width X of the parallel SAW resonators is preferably 1.10 to 1.16 $\mu$m and the width of the series SAW resonators is preferably 1.05 to 1.11 $\mu$m. Here, the period ($\lambda$) of the comb-like electrode is typically four times as long as X.

The aperture length Y of the SAW resonator is preferably 60 to 120 $\mu$m in the case of parallel SAW resonator and is preferably 40 to 80 $\mu$m in the case of series SAW resonator if the filter is to be used as a 800 MHz band filter.

The number of electrode finger pairs Z in the comb-like electrode is preferably 40 to 120 in the case of parallel SAW resonator and is preferably 60 to 130 in the case of series SAW resonator if the filter is to be used as a 800 MHz band filter.

The electrode construction of the SAW resonator shown in FIG. 1 is exemplary only and the construction of the SAW resonator of the present invention should not be specifically limited to the one shown in FIG. 1 alone.

The above-described SAW resonator of the present invention can be applied to a filter, a resonator, a delay line, an oscillator, a matched filter, an acousto-optical device, a convolver, and the like.

EMBODIMENTS

The First Embodiment and Comparisons 1 to 4

Since the weight of the electrode varies the central frequency by mass-loading effect in the SAW resonator, laminates were formed with the following thicknesses on a 36° Y cut-X propagation LiTaO$_3$ substrate by DC magnetron sputtering method taking the specific weight of each of the metals into consideration.

Namely, three-layer films of

Al (1750 Å)/Mg (300 Å)/Al (1750 Å) (First Embodiment)

Al (1350 Å)/Cu (300 Å)/Al (1350 Å) (Comparison 1),

Al (1450 Å)/Cr (300 Å)/Al (1450 Å) (Comparison 2),

Al (1280 Å)/Mo (300 Å)/Al (1280 Å) (Comparison 3), and a single layer film of

Al-(2% by weight)Cu (3700 Å) (Comparison 4) were formed as laminates.

Figure 2:
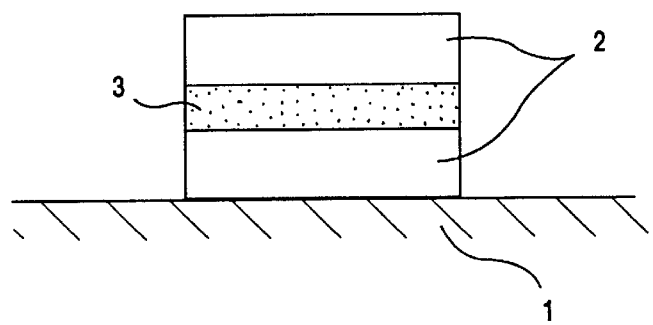
FIG. 2 is a schematic cross-sectional view showing an electrode according to the present invention.

Here, the above three-layer films are laminated specifically as shown in FIG. 2, where the reference numerals 1, 2 and 3 represent a substrate, the first film and the second film, respectively.

Figure 3:
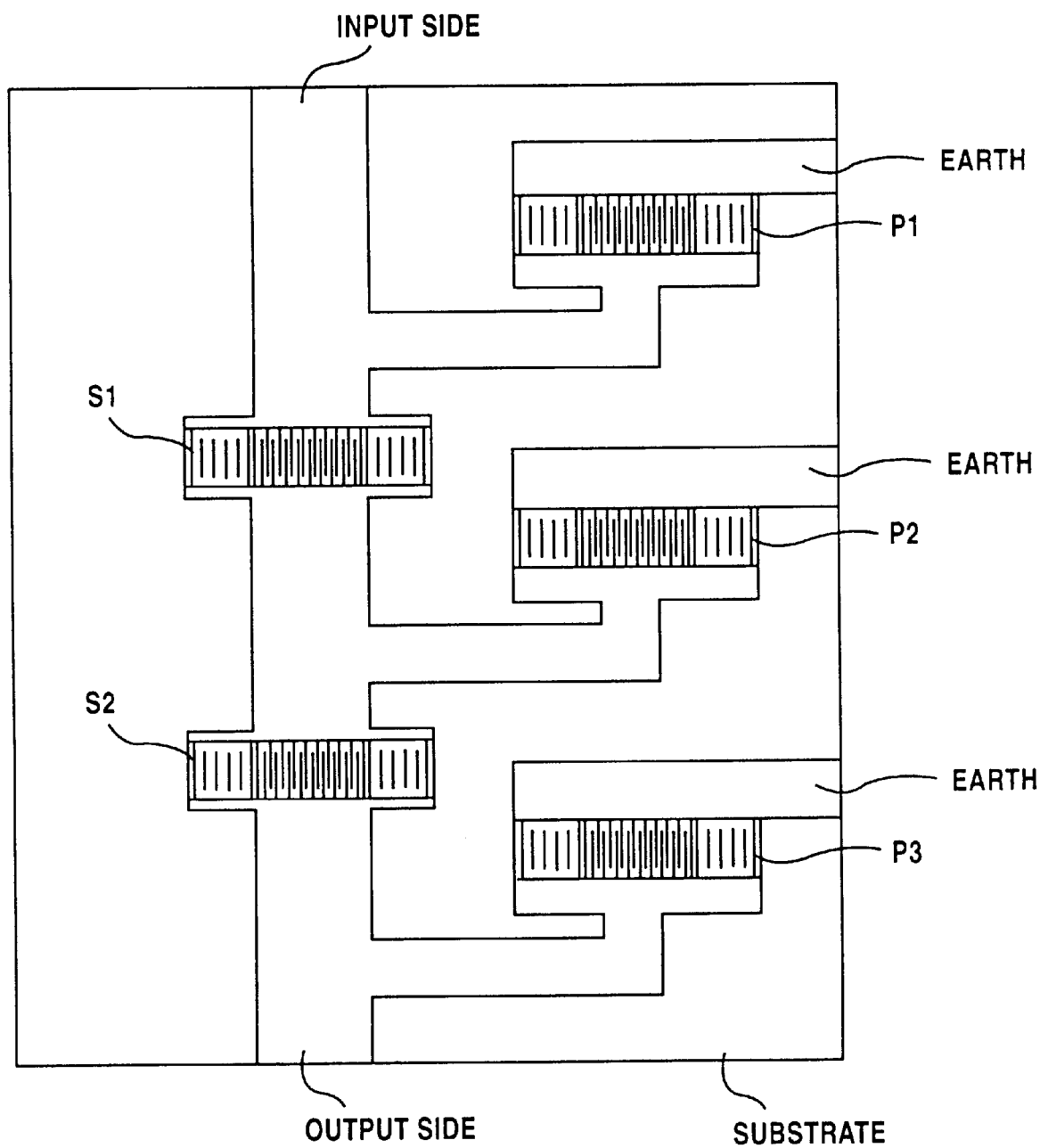
FIG. 3 is a schematic plan view showing a receiving filter according to the present invention.
Figure 4:
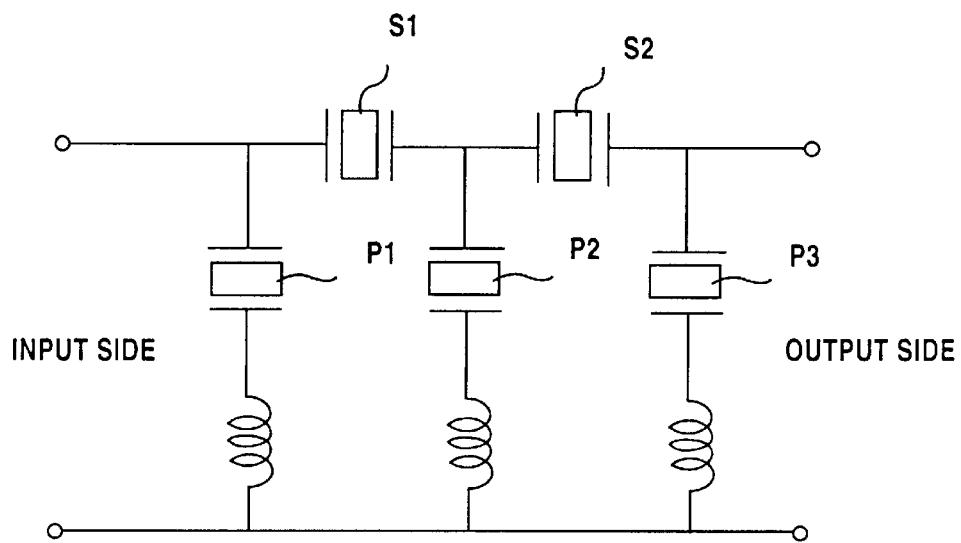
FIG. 4 shows an equivalent circuit of FIG. 3.
Figure 5:
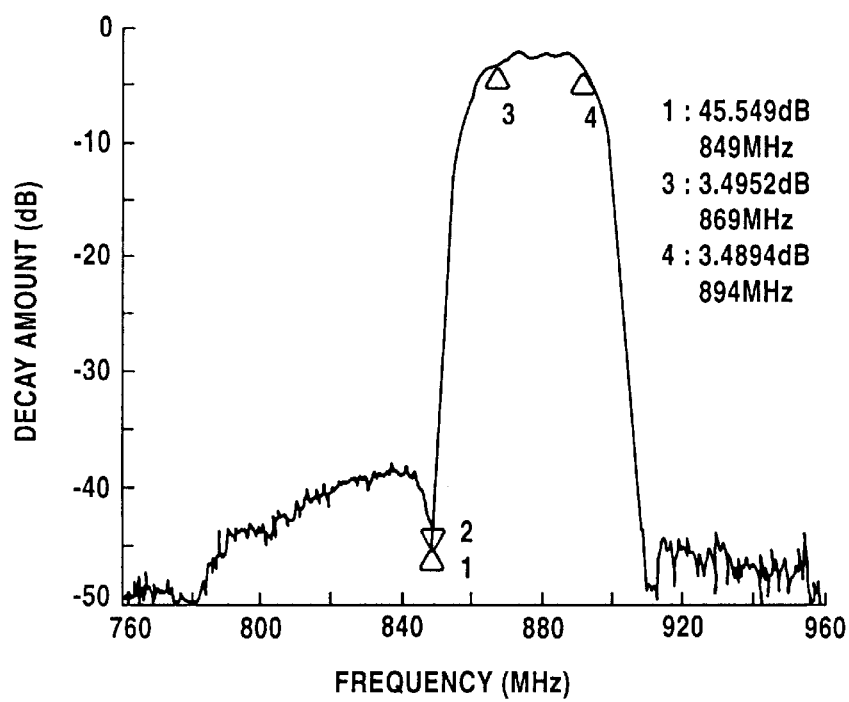
FIG. 5 is a graph showing a transmission characteristic of the receiving filter of FIG. 3.

The above electrodes were patterned by dry etching method to form a receiving filter in which a plurality of SAW resonators were connected in a series arm and a parallel arm in a ladder-like shape, as shown in FIG. 3. Referring to FIG. 3, S1 and S2 represent series SAW resonators and P1, P2 and P3 represent parallel SAW resonators. FIG. 4 shows an equivalent circuit of the receiving filter of FIG. 3. Further, individual SAW resonators have a structure shown in FIG. 1. In the case of parallel SAW resonators, the period (λ) of the comb-like electrode was 4.53 μm, the aperture length Y was 80 μm, and the number of electrode finger pairs Z in the comb-like electrode was 116 for P1 and P3; and was 4.53 μm, Y was 150 μm, and the number of electrode finger pairs Z was 124 for P2. On the other hand, in the case of series SAW resonators, the period (λ) of the comb-like electrode was 4.32 μm, the aperture length Y was 60 μm, and the number of electrode finger pairs Z in the comb-like electrode was 70. This receiving filter is a filter to be used in AMPS-Rx for antenna wave separator (receiving band: 869 to 894 MHz), and the electric power leakage from the transmitting filter (transmitting band: 824 to 849 MHz) is applied to the attenuation region on the low frequency side of the receiving filter. The transmission characteristic of the receiving filter is shown in FIG. 5.

Figure 6:
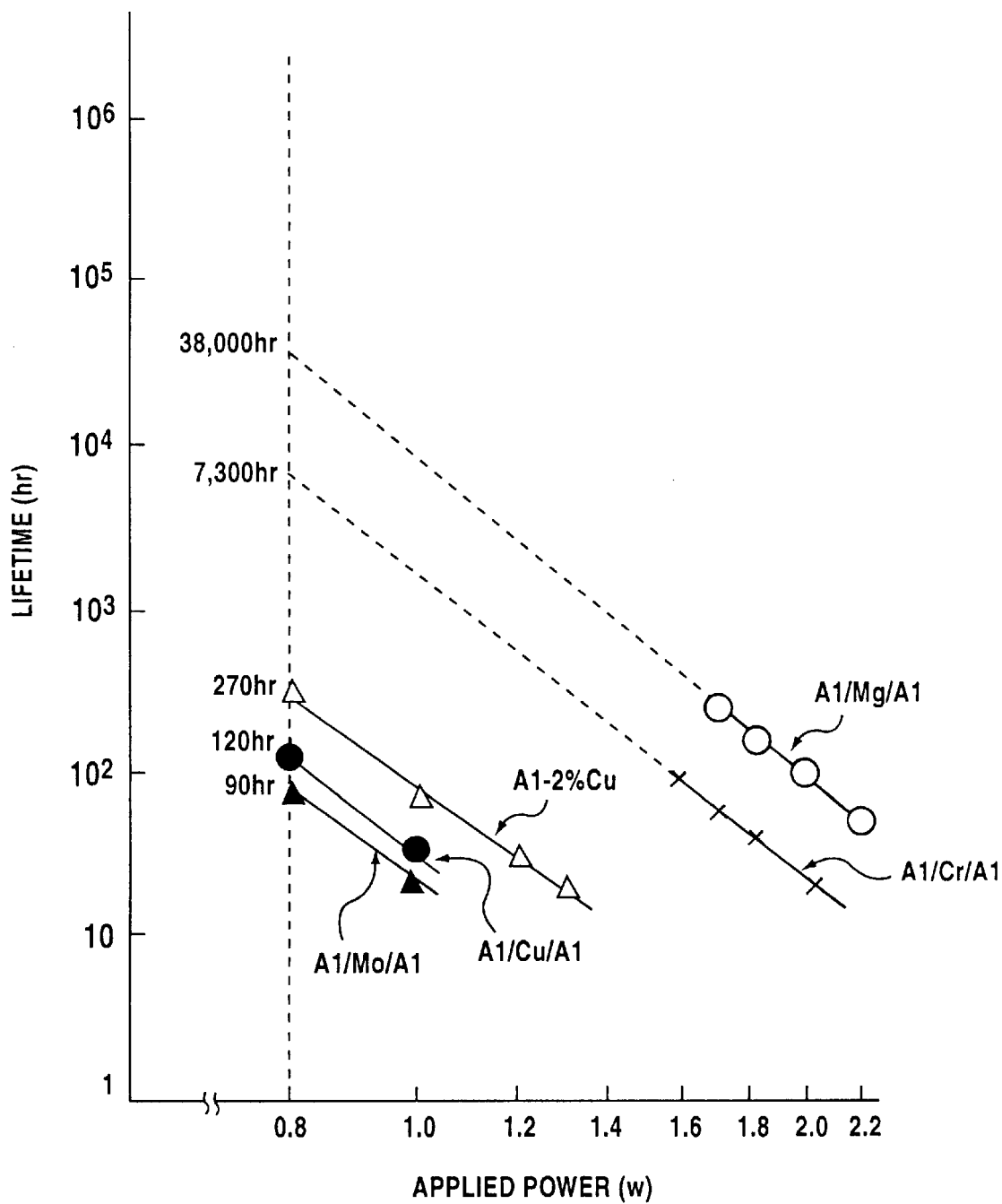
FIG. 6 is a graph showing a relationship between the lifetime of the receiving filter and the applied power according to a first embodiment of the present invention.

The lifetime of the receiving filter formed as shown above was measured by setting the environment temperature to be 85° C., the electric power to be 0.8 W, and the applied frequency to be 849 MHz which is the weakest in the above frequency band in applying the electric power. Here, the life time represents a period of time until the bandwidth decreases by 2 MHz, and a longer lifetime signifies a larger high-power durability. With respect to filters having a long lifetime, the lifetime was measured with increased electric power and the lifetime at 0.8 was estimated by extrapolation using an Arrhenius model. The relationship between the lifetime and the applied electric power is shown in FIG. 6. Here, 50000 hours is a criterion for the lifetime at 0.8 W.

Al/Mg/Al provided the longest lifetime of 38000 hours at 0.8 W. Al/Cu/Al, Al—(2 wt %)Cu, Al/Cr/Al and Al/Mo/Al provided a lifetime of 7300, 270, 120 and 90 hours, respectively.

Although Al/Mg/Al of the first embodiment has not cleared the criterion of 50000 hours, it is possible to use it by making an improvement in designing the receiving filter or adding a second element to pure Al.

The SAW resonators of the first embodiment and Comparisons 1 to 4 were analyzed by diffraction analysis using a transmission electron microscope and an energy dispersing X-ray spectroscopy (EDX). The result showed that a solid solution layer or an alloy layer was formed in Al/Mg/Al and Al/Cu/Al which provided a lifetime longer than that of Al-(2 wt %)Cu, whereas Co and Mo remained as pure metals in Al/Cr/Al and Al/Mo/Al which provided a lifetime shorter than that of Al-(2 wt %)Cu. This seems to show that the formation of a solid solution layer or an alloy layer has a great influence on the high-power durability of the device.

Also, from the above analysis, it is understood that a similar result will be obtained even if the first film forms a lower layer and the second film forms an upper layer.

Embodiments Second and Third

Figure 7:
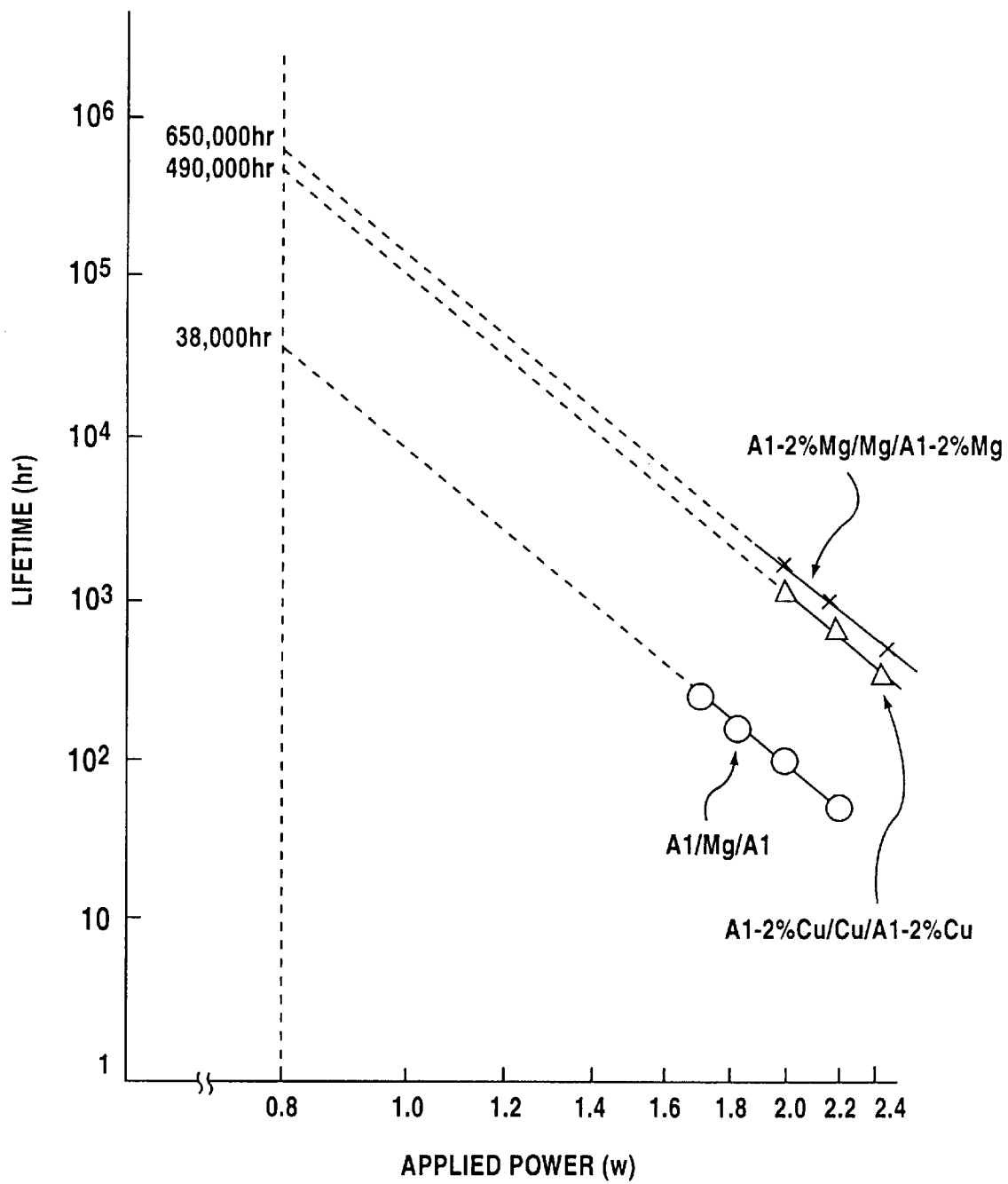
FIG. 7 is a graph showing a relationship between the lifetime of the receiving filter and the applied power according to a second embodiment of the present invention.

In the Second and Third Embodiments, SAW resonators were fabricated in the same manner as in the First Embodiment except that Al-(2% by weight) Cu (Second Embodiment) or Al-(2% by weight )Mg (Third Embodiment) was used for the first film of the First Embodiment, and the lifetime was measured. FIG. 7 shows a relationship between the lifetime and the applied electric power.

While Al/Mg/Al provides a lifetime of 38000 hours at 0.8 W, Al—(2% by weight)Cu/Mg/Al—(2% by weight)Cu and Al—(2 by weight)Mg/Mg/Al—(2% by weight) Mg provided a lifetime of 490000 and 650000 hours, respectively, which shows a great improvement. However, while Al/Mg/ Al provided the minimum insertion loss of 2.1 dB in the receiving filter, Al—(2% by weight)Cu/Mg/Al—(2% by weight)Cu and Al—(2% by weight)Mg/Mg/Al—(2% by weight)Mg provided 2.3 and 2.4 dB, respectively, which shows a small increase.

Fourth Embodiment

A three-layer film of Al/Mg/Al was used as an electrode of a filter for personal communication network (PCN) (transmitting band: 1710 to 1785 MHz) to examine the bandwidth in the transmission characteristics and the influence on the high-power durability of the filter. However, the film thickness of the second film (Mg) relative to the total thickness of the electrode was varied within the range from 0 to 20%. Here, the filter was allowed to have a structure of P-S-P'-S-P (wherein P and P' are parallel SAW resonators, and S is a series SAW resonator). With respect to the resonator P, the period was 2.3 μm; the aperture length was 80 μm; the number of electrode finger pairs was 55; and the number of grids in the reflectors was 100. With respect to the resonator P', the period was 2.3 μm; the aperture length was 100 μm; the number of electrode finger pairs was 90; and the number of grids in the reflectors was 100. With respect to the resonator S, the period was 2.2 μm; the aperture length was 40 μm; the number of electrode finger pairs was 105; and the number of grids in the reflectors was 100. Further, in this embodiment, the high-power durability was represented by measuring the maximum input power, and the maximum input power was measured by the following method.

The environment temperature was set to be 85° C., and the applied frequency was set to be 1785 MHz, which provides the weakest high-power durability in the transmitting band. Then, after an input power of 1.0 W was applied to the filter for 5 minutes, the transmission characteristic was measured by using a network analyzer. If the transmission characteristic did not deteriorate, the input power was increased by 0.1 W, and the transmission characteristic was measured by applying an input power of 1.1 W in the same manner as above. This step was repeated until the transmission characteristic began to deteriorate. The input power at the time when the transmission characteristics began to deteriorate was defined as "the maximum input power". The standard for judging the deterioration was set to be the time when the bandwidth of 4 dB decreased by 3 MHz or when the maximum insertion loss increased by 2 dB.

Figure 8:
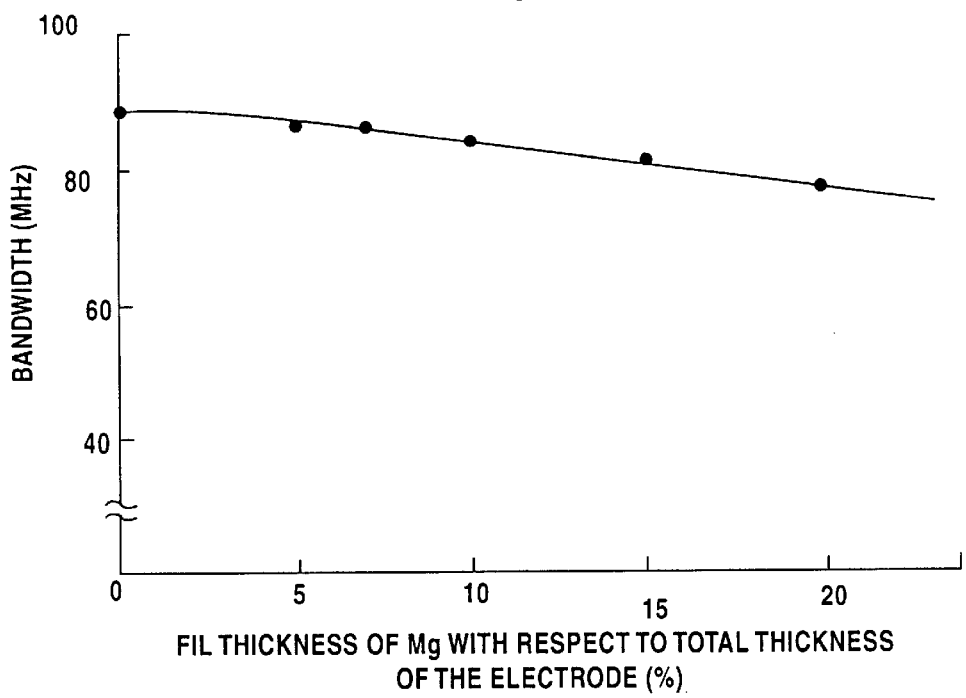
FIG. 8 is a graph showing the dependence of the bandwidth of the filter for PCN on the film thickness of Mg according to a fourth embodiment of the present invention.
Figure 9:
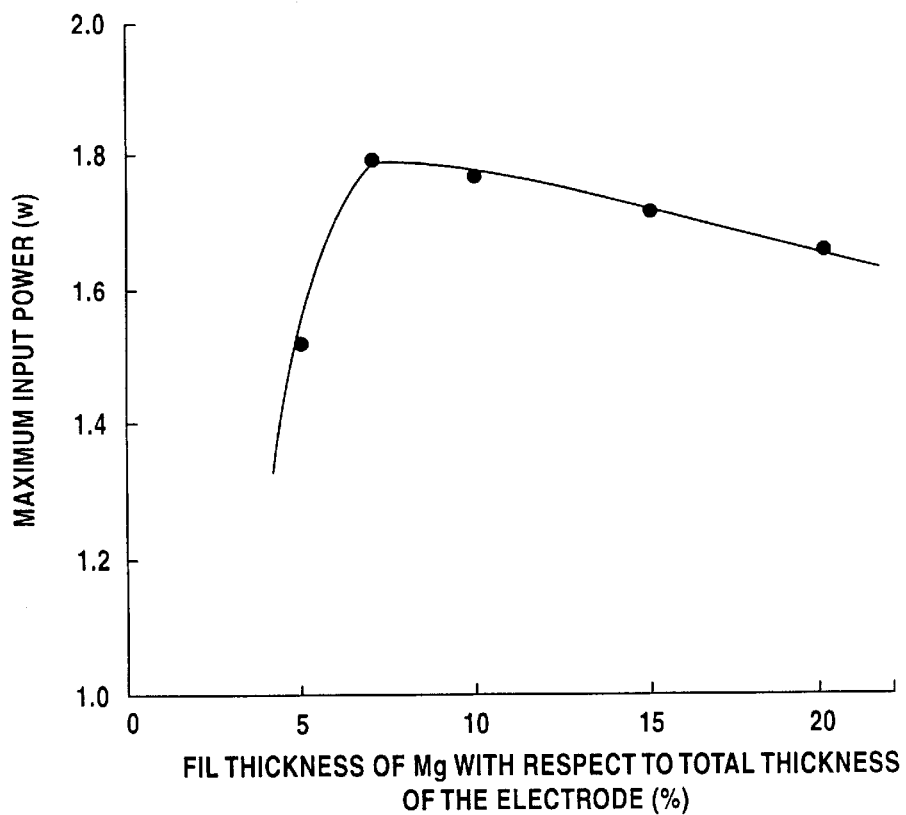
FIG. 9 is a graph showing the dependence of the maximum input power of the filter for PCN on the film thickness of Mg according to fourth embodiment of the present invention.

The result is shown in FIGS. 8 and 9. FIG. 8 shows a dependence of the bandwidth on the film thickness of Mg, and FIG. 9 shows a dependence of the maximum input power on the film thickness of Mg. In FIG. 8, the bandwidth decreases according as the film thickness of Mg increases. However, the decrease in the bandwidth was not sharp and was within the range which is acceptable for using it as a filter. On the other hand, FIG. 9 shows that the maximum input power increases if the film thickness of Mg is within the range from 5 to 20% of the total thickness of the electrode. Here, if the maximum input power is large, it means that the high-power durability is large. Therefore, the film thickness within the above range has been found to be especially preferable for the present invention.

As described in detail above, the SAW resonator of the present invention comprises an electrode formed by a first film and a second film on a substrate, the first film comprising an Al film or a film formed by adding at least one other element to Al, and the second film comprising a metal whose coefficient of diffusion into Al is greater than a self diffusion coefficient of Al.

Therefore, the high-power durability of the electrode can be tremendously improved when it is compared with the conventional Al—(several %)Cu electrode. Moreover, the SAW resonator of the present invention can be used in an antenna duplexer and for semi-microwave band filters which is now becoming more and more utilized.

Also, the high-power durability of the electrode can be improved by allowing the electrode to comprise an alloy or solid solution layer formed by interdiffusion of the first film and the second film.

Further, an electrode with improved high-power durability can be obtained by:
(1) letting the other element to be at least one selected from the group consisting of Mg, Cu, Ti, Pd, Ge, and Si; and/or
(2) allowing the first film to contain Al at more than 90 wt %, and letting the metal in the second film to be selected from the group consisting of Mg, Si, In, Ge, Li, Na, Mn, Ag, Au, Ga, and Co. The high-power durability of the electrode will be further improved if the second film is formed of Mg. The high-power durability of the electrode will be especially improved if the second film comprising Mg occupies 5 to 20% of the total thickness of the electrode.

Also, the method of manufacturing a surface acoustic wave device according to the present invention comprises an electrode formation step and a subsequent necessary steps for completing the device, wherein the electrode formation step includes laminating a first film and a second film on a substrate and patterning the laminated films into a desired shape, the first film comprising an Al film or a film formed by adding at least one other element to Al, the second film comprising a metal whose coefficient of diffusion into Al is greater than a self diffusion coefficient of Al, and all the steps being performed at temperatures below 200° C. The method provides a simple method of manufacturing a SAW resonator.

Further, an electrode having a better film quality can be obtained by allowing the first film and the second film to be laminated by DC magnetron sputtering method.

Also, a fine pattern of electrodes can be formed without causing a damage to the substrate by allowing the patterning of the laminated films to be performed by reactive ion etching method.

What we claim is:

1. A surface acoustic wave device comprising an electrode formed by a first film and a second film on a substrate, the first film comprising an Al film or a film formed by adding Al and at least one other, and the second film consisting of a metal other than Al and lighter than Cu whose coefficient of diffusion into Al is greater than a self diffusion coefficient of Al.

2. A surface acoustic wave device according to claim 1, in which the electrode is formed by laminating the first film and the second film alternately.

3. A surface acoustic wave device according to claim 1, in which the electrode comprises an alloy or solid solution layer formed by interdiffusion of the first film and the second film.

4. A surface acoustic wave device according to claim 1, in which the electrode comprises the first film, the second film, and an alloy or solid solution layer formed at the interface between the first film and the second film.

5. A surface acoustic wave device according to claim 1, in which the other element is at least one selected from the group consisting of Mg, Cu, Ti, Pd, Ge, and Si.

6. A surface acoustic wave device according to claim 1, in which the first film contains Al at a concentration of more than 90 % by weight.

7. A surface acoustic wave device according to claim 6, in which the other element is Mg, Cu or Ti.

8. A surface acoustic wave device according to claim 1, in which the metal in the second film is selected from the group consisting of Mg, Si, In, Ge, Li, Na, Mn, Ga, and Co.

9. A surface acoustic wave device according to claim 1, in which the second film is formed of Mg.

10. A surface acoustic wave device according to claim 9, in which the second film occupies 5 to 20 % of the total thickness of the electrode.

11. A method of manufacturing a surface acoustic wave device, comprising the step of forming an electrode including the step of laminating a first film and a second film on a substrate and the step of patterning the laminated films into a desired shape, the first film comprising an Al film or a film formed by adding Al and at least one other element, the second film consisting of a metal other than Al and lighter than Cu whose coefficient of diffusion into Al is greater than a self diffusion coefficient of Al, wherein all the steps are performed at temperatures below 200° C.

12. A method of manufacturing a surface acoustic wave device according to claim 11, in which the first film and the second film are laminated by a DC magnetron sputtering method.

13. A method of manufacturing a surface acoustic wave device according to claim 12, in which the patterning of the laminated films is performed by reactive ion etching method.

* * * * *